(12) United States Patent
Beck et al.

(10) Patent No.: US 8,000,756 B2
(45) Date of Patent: Aug. 16, 2011

(54) RECEIVER HAVING LOW POWER CONSUMPTION AND METHOD THEREOF

(75) Inventors: Sung-ho Beck, Seongnam-si (KR);
Sung-hyuk Lee, Seoul (KR);
Myung-woon Hwang, Seoul (KR)

(73) Assignee: Silicon Motion, Inc., Zhubei (TW)

( * ) Notice: Subject to any disclaimer, the term of this patent is extended or adjusted under 35 U.S.C. 154(b) by 441 days.

(21) Appl. No.: 12/369,930

(22) Filed: Feb. 12, 2009

(65) Prior Publication Data

US 2009/0209220 A1    Aug. 20, 2009

(30) Foreign Application Priority Data

Feb. 14, 2008   (KR) .................. 10-2008-0013266

(51) Int. Cl.
*H04M 1/00* (2006.01)
(52) U.S. Cl. ................... 455/574; 455/194.2; 455/232.1
(58) Field of Classification Search .................. 455/574, 455/194.2, 200.1, 226.1, 239.1, 245.1, 232.1
See application file for complete search history.

(56) References Cited

U.S. PATENT DOCUMENTS

| | | | | |
|---|---|---|---|---|
| 6,134,430 | A * | 10/2000 | Younis et al. | 455/340 |
| 6,993,291 | B2 * | 1/2006 | Parssinen et al. | 455/67.11 |
| 7,548,738 | B2 * | 6/2009 | Srinivasan et al. | 455/232.1 |
| 7,894,786 | B2 * | 2/2011 | Hwang | 455/245.1 |

* cited by examiner

*Primary Examiner* — James H Cho
(74) *Attorney, Agent, or Firm* — Kirton & McConkie; Evan R. Witt

(57) ABSTRACT

The present invention provides a receiver having low power consumption and method thereof. The receiver with low power consumption adjusts the gain based on the automatic gain control information. The receiver acquires the signal peaks both after and before a channel selection filter and further analyzes the wanted signal and interference signal with respect to the signal peaks. The receiver determines the magnitude of the wanted signal and determines whether the interference signal exists. The receiver provides the signals with optimal current correspondingly in order to effectively decrease the power consumption of the receiver.

7 Claims, 6 Drawing Sheets

RECEIVER HAVING LOW POWER CONSUMPTION AND METHOD THEREOF

FIELD OF THE INVENTION

The present invention relates to a receiver and method thereof, and more particularly to a receiver having low power consumption and method thereof, wherein the receiver with low power consumption adjusts the gain based on the automatic gain control information, the receiver acquires the signal peaks both after and before a channel selection filter for further analyzing the wanted signal and interference signal with respect to the signal peaks, the receiver determines the magnitude of the wanted signal and determines whether the interference signal exists, and the receiver provides the signals with optimal current correspondingly in order to effectively decrease the power consumption.

BACKGROUND OF THE INVENTION

Conventionally, the frequency spectrum of the receiver of the communicating system has a large scale variation and the precision wireless signal received by the receiver is affected by not only the amplitude of the wanted signal but also the interference signal (or termed "jammer") which is inherent in the adjacent frequency bands. Therefore, when the receiver detects the minimum and maximum power of the waned signal, and the interference signal is inherent in the adjacent frequency bands, the receiver has to further process the wireless signal.

As shown in FIG. 1, it is a schematic block diagram of conventional receiver 100 with an automatic gain control. The receiver 100 includes an antenna 101, a low noise amplifier (LNA) 102, a frequency converter 103, a channel selection filter (CSF) 104 and a programmable gain amplifier (PGA) 105.

The receiver 100 receives the ultra-high signal by the antenna 101 and the low noise amplifier (LNA) 102 amplifies the received signal. The frequency converter 103 down-converts the frequency of the received signal. As shown in FIG. 2, it is a schematic view of a circuit diagram of a channel selection filter 104 of biquad operational amplifier. The channel selection filter 104 filters away the interference signal of the received signal. As shown in FIG. 3, it is a schematic view of a circuit diagram of a programmable gain amplifier 105. The programmable gain amplifier 105 composed of amplifiers amplifies the received signal and outputs a signal at a predetermined amplitude.

The transfer function of the channel selection filter (CSF) 104 is represented as formula 1 (E1), and the transfer function of the programmable gain amplifier (PGA) 105 is represented as formula 2 (E2):

$$\frac{V_o}{V_i} = \frac{S^2 C_2 C_3 + S\frac{C_1 - C_x}{R_3} + \frac{1}{R_1 R_3}}{S^2 C_2 C_4 + S\frac{C_2}{R_4} + \frac{1}{R_2 R_3}} \quad \text{(E1)}$$

$$\text{Gain} = -\frac{R_{302}}{R_{301}} \quad \text{(E2)}$$

In addition, the receiver 100 further includes a first peak detector 1 (PD1) 107, a second peak detector (PD2) 109, a first automatic gain control (AGC1) 108, a second automatic gain control (AGC2) 110. The first peak detector (PD1) 107 is used to detect the signal before being inputted into the channel selection filter (CSF) 104, and the second peak detector (PD2) 109 is used to detect the signal after being outputted from the channel selection filter (CSF) 104. The first automatic gain control (AGC1) 108 adjusts the gain of the low noise amplifier 102 and frequency converter 103 according to the first detecting value of the first peak detector (PD1) 107. The second automatic gain control (AGC2) 110 adjusts the gain of the channel selection filter (CSF) 104 and programmable gain amplifier 105 according to the second detecting value of the second peak detector (PD2) 109.

Therefore, the first peak detector (PD1) 107 in front of the channel selection filter (CSF) 104 detects the total amplitude of the inputted signal including the wanted signal and interference signal which is inherent in the inputted signal. The first automatic gain control (AGC1) 108 adjusts the gain of the low noise amplifier 102 and frequency converter 103 according to the total amplitude of the inputted signal, so that the inputted signal before the channel selection filter (CSF) 104 maintains the amplitude constant. The receiver 100 prevents the signal from distortion due to the side effect of the interference signal.

Moreover, the second peak detector (PD2) 109 is after the channel selection filter (CSF) filters 104 that reduces the interference signal. The second peak detector (PD2) 109 detects the amplitude of the signal which is composed of wanted signal, and the second automatic gain control (AGC2) 110 then adjusts the gain of the channel selection filter (CSF) 104 and programmable gain amplifier 105 according to the amplitude for maintaining the amplitude constant.

As shown in FIG. 4, it is a schematic view of the characteristics profile of out-band $3^{rd}$ input intercept point (IIP3) of an operational amplifier, corresponding to the interference signal. With the increment of the gain-bandwidth (GBW), the current associated with the gain-bandwidth (GBW) is increased positively. When the value of the $3^{rd}$ input intercept point circuit (IIP3) is higher, the distortion of the inputted signal is decreased. For the purpose of lower distortion, it is necessary to provide higher current for the optimal $3^{rd}$ input intercept point (IIP3). However, such a situation considerably increases the power consumption of the receiver 100.

Conventionally, when the channel selection filter (CSF) 104 and programmable gain amplifier 105 are utilized in the receiver, only the current satisfying the noise at the optimal point is required. Unfortunately, as shown in FIG. 5, for achieving better immunity from interference signal, it is necessary to provide higher current than the current of the noise at the optimal point, i.e. supply the higher current to the low noise amplifier 102 and frequency converter 103, so that an optimal point that the noise is minimum is achieved, and the optimal $3^{rd}$ input intercept point (IIP3) is maximum.

The frequency spectrum of the receiver of the communicating system has a large scale variation, and the interference signal is sometimes inherent in the adjacent frequency bands of the wanted signal.

Since the interference signal has ill effects on the wanted signal, the channel selection filter is used to filter the interference signal and reduce the amplitude of the interference signal. However, when the channel selection filter (CSF) 104 and programmable gain amplifier 105 have to be operated precisely in the worst case, i.e. the wanted signal is low, and the interference signal is high, it is required to exert high current on the channel selection filter (CSF) 104 and programmable gain amplifier 105. Such that the signal distortion is minimum, and the optimal $3^{rd}$ input intercept point (IIP3) is maintained.

It is necessary to provide high current not only in the worst case, as mentioned above, but also when the interference signal is not inherent in the wanted signal. Therefore, high current is provided to the receiver for maintaining the optimal $3^{rd}$ input intercept point (IIP3), and excessive current is thus supplied to the receiver, thereby resulting in undue power consumption.

Furthermore, when no interference signal exists, and the amplitude of the wanted signal is higher and even though the characteristics profile of the noise is bad and the distortion of the signal is small, the receiver still consumes large power. Consequentially, there is a need to develop a novel receiver solve the aforementioned problem of power consumption.

SUMMARY OF THE INVENTION

An objective of the present invention is to provide a receiver having low power consumption and method thereof. The receiver with low power consumption adjusts the gain based on the automatic gain control information, the receiver acquires the signal peaks both after and before a channel selection filter for further analyzing the wanted signal and interference signal with respect to the signal peaks, the receiver determines the magnitude of the wanted signal and determines whether the interference signal exists, and the receiver provides the signals with optimal current correspondingly in order to effectively decrease the power consumption.

According to the above objective, the present invention sets forth a receiver having low power consumption and method thereof. The receiver amplifies an ultra-high frequency signal received from the antenna by the low noise amplifier (LNA). The frequency converter down-converts a frequency of the ultra-high frequency signal for outputting a down-converted signal. The channel selection filter (CSF) filters away an interference signal of the down-converted signal. At least one programmable gain amplifier (PGA) amplifies the down-converted signal for outputting a gain-amplified signal having a predetermined constant amplitude. Further the first peak detector (PD1) of the receiver detects the frequency-reduced signal before being inputted into the channel selection filter (CSF) and generates a first detecting value. The first automatic gain control (AGC1) adjusts a gain of either the low noise amplifier (LNA) and/or the frequency converter based on the first detecting value. The second peak detector (PD2) of the receiver detects the frequency-reduced signal after being outputted from the channel selection filter (CSF) and generates a second detecting value. The second automatic gain control (AGC2) adjusts the gain of either the channel selection filter (CSF) and/or the programmable gain amplifier (PGA) based on the second detecting value.

The advantages of the present invention include: (1) The power consumption reducing device compares the first automatic gain control (AGC) information and the second automatic gain control (AGC) information with a setting threshold value to determined the amplitude of the wanted signal and the existence of the interference signal; and (2) Based on the signal quality of the signal, proper current is provided for the channel selection filter (CSF) of the receiver to improve the power consumption of the receiver, wherein the undue power consumption represents that maximum is still provided when the interference signal is high.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENTS

Figure 1:
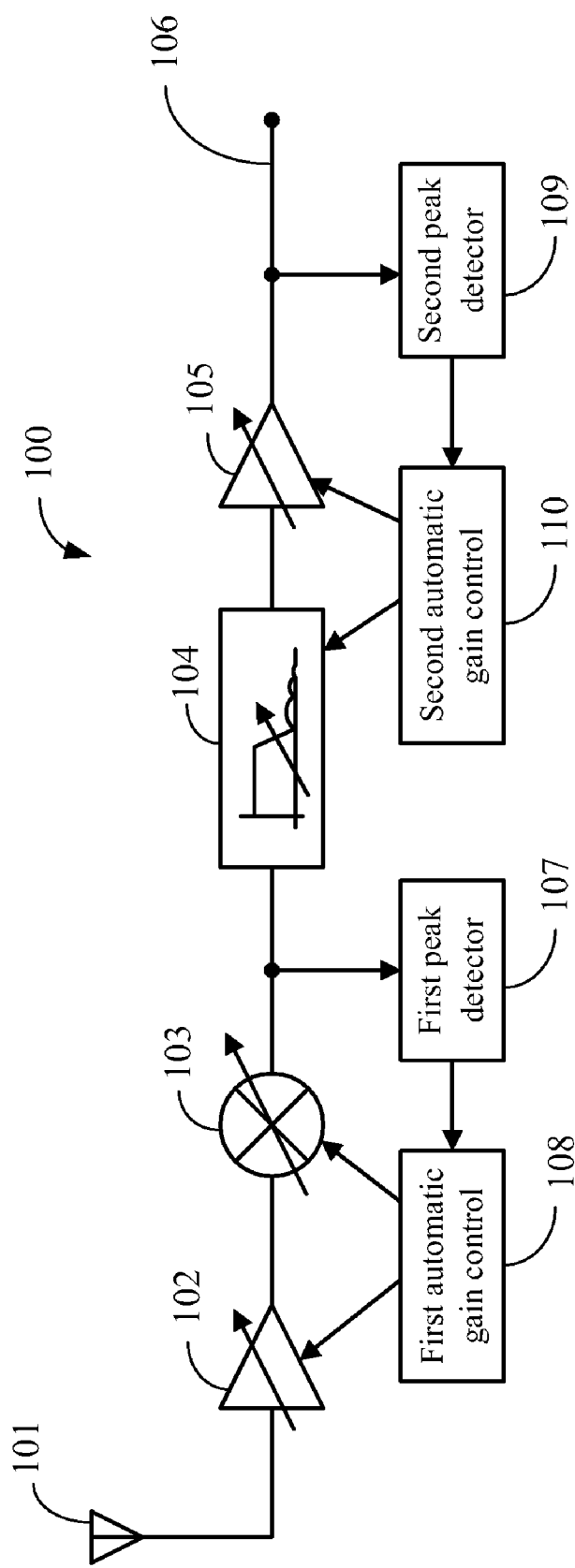
FIG. 1 is a schematic block diagram of conventional receiver with an automatic gain control.
Figure 2:
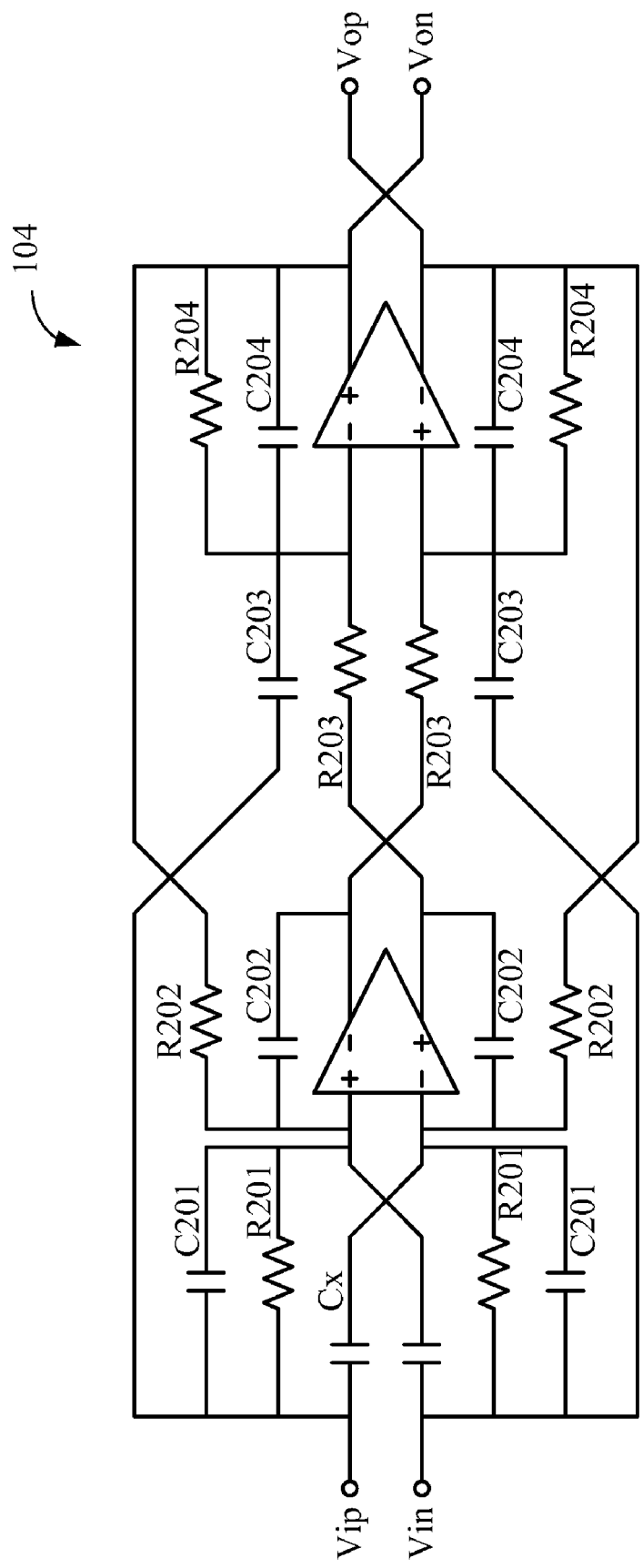
FIG. 2 is a schematic view of a circuit diagram of a channel selection filter of biquad operational amplifier in the prior art.
Figure 3:
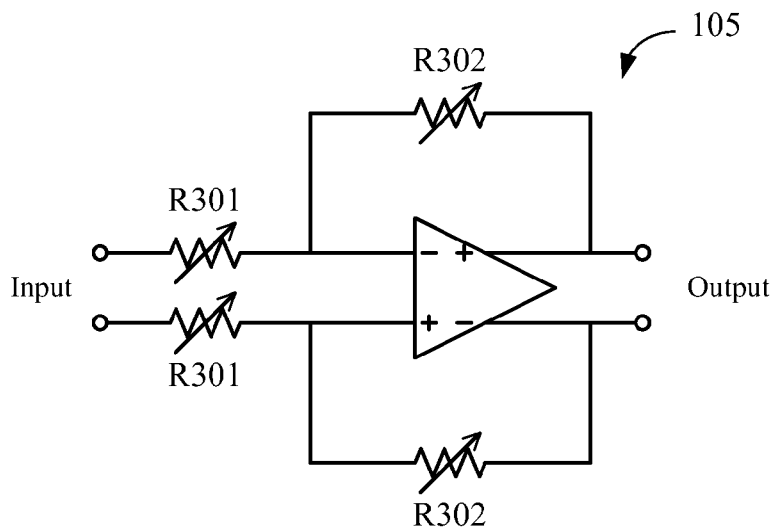
FIG. 3 is a schematic view of a circuit diagram of a programmable gain amplifier in the prior art.
Figure 4:
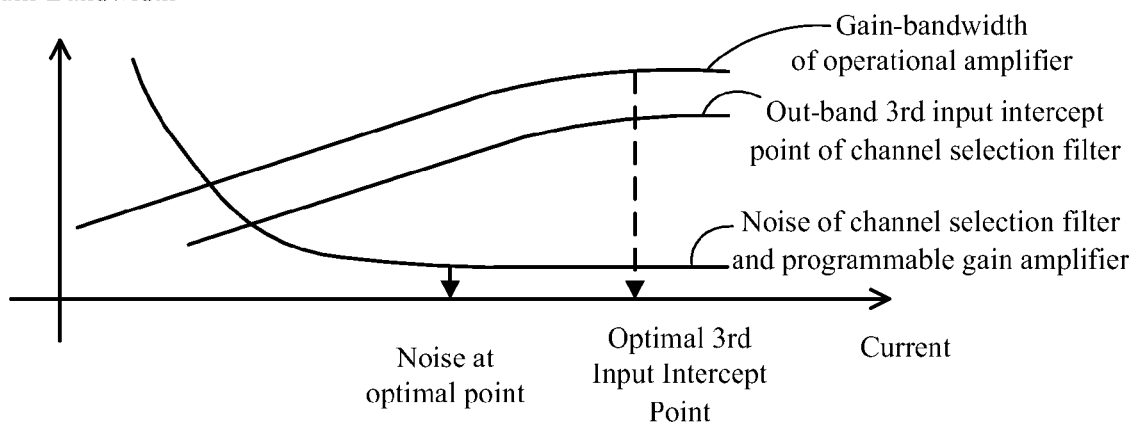
FIG. 4 is a schematic view of the characteristics profile of an operational amplifier based on the gain-bandwidth, $3^{rd}$ input intercept point, and the noise in the prior art.
Figure 5:
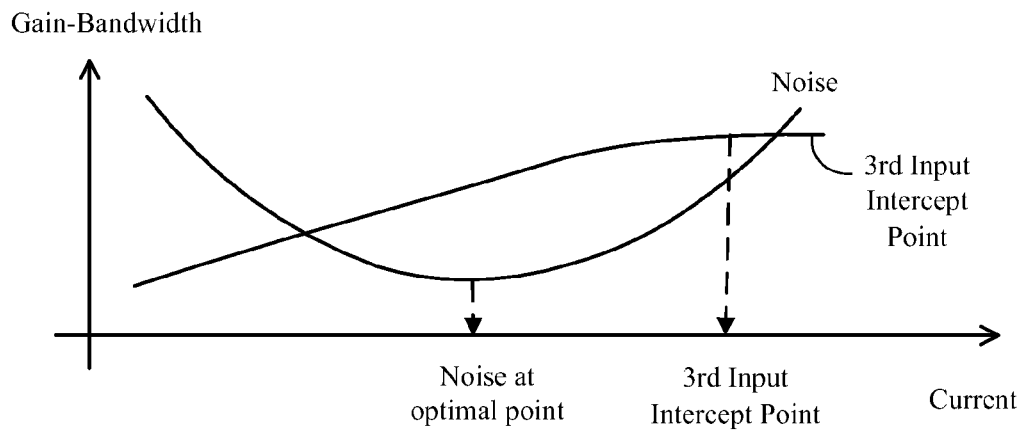
FIG. 5 is a schematic view of the characteristics profile of a low noise amplifier and frequency converter based on the relation ship between the noise and $3^{rd}$ input intercept point circuit (IIP3) in the prior art.
Figure 6:
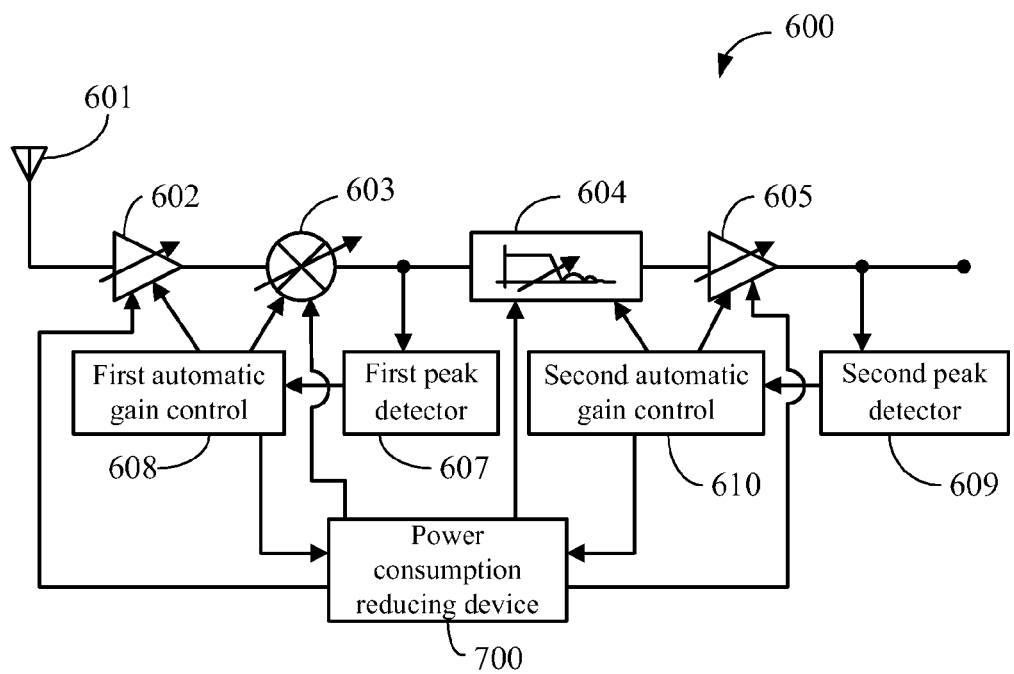
FIG. 6 is a schematic block diagram of the receiver having a power consumption reducing device according to one embodiment of the present invention.

FIG. 6 is a schematic block diagram of the receiver 600 having a power consumption reducing device according to one embodiment of the present invention. The receiver 600 includes an antenna 601, a low noise amplifier (LNA) 602, a frequency converter 603, a channel selection filter (CSF) 604, a programmable gain amplifier (PGA) 605, a first peak detector (PD1) 607, a second peak detector (PD2) 609, a first automatic gain control (AGC1) 608, and a second automatic gain control (AGC2) 610.

The receiver 600 amplifies an ultra-high frequency signal received from the antenna 601 by the low noise amplifier (LNA) 602. The frequency converter 603 down-converts a frequency of the ultra-high frequency signal for outputting a down-converted signal. The channel selection filter (CSF) 604 filters away an interference signal of the down-converted signal. At least one programmable gain amplifier (PGA) 605 amplifies the down-converted signal for outputting a gain-amplified signal having a predetermined constant amplitude. Further, the first peak detector (PD1) 607 of the receiver 600 detects the down-converted signal before being inputted into the channel selection filter (CSF) 604 and generates a first detecting value. The first automatic gain control (AGC1) 608 adjusts a gain of either the low noise amplifier (LNA) 602 and/or the frequency converter 603 based on the first detecting value. The second peak detector (PD2) of the receiver 600 detects the down-converted signal after being outputted from the channel selection filter (CSF) 604 and generates a second detecting value. The second automatic gain control (AGC2) 610 adjusts the gain of either the channel selection filter (CSF) 604 and/or the programmable gain amplifier (PGA) 605 based on the second detecting value.

The receiver 600 further includes a power consumption reducing device 700 connected to the first automatic gain control (AGC1) 608 and second automatic gain control (AGC2) 610 for receiving the first automatic gain control (AGC) information and the second automatic gain control (AGC) information. The power consumption reducing device 700 determines the signal quality of the ultra-high frequency signal received from the antenna 601 by comparing the first automatic gain control (AGC) information, e.g. first detecting value, and the second automatic gain control (AGC) information, e.g. second detecting value, with a setting threshold value, respectively. The power consumption reducing device 700 adjusts the current supplied to at least one of the low noise amplifier (LNA) 602, the frequency converter 603, the channel selection filter (CSF) 604 and the at least one programmable gain amplifier (PGA) 605 according to the determined result.

Figure 7:
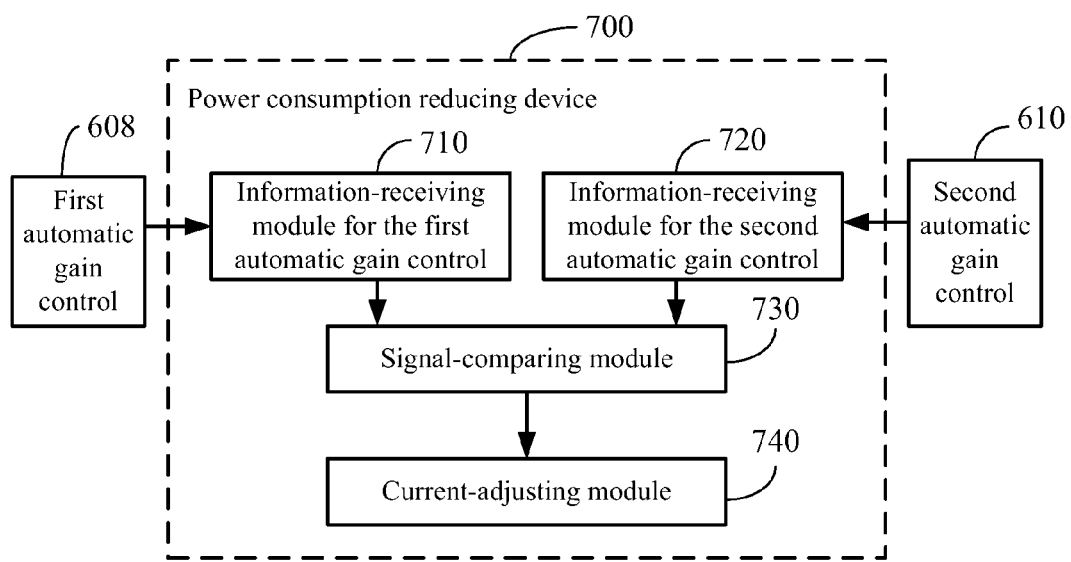
FIG. 7 is a schematic block diagram of the power consumption reducing device according to one embodiment of the present invention.

FIG. 7 is a schematic block diagram of the power consumption reducing device 700 according to one embodiment of the present invention. The power consumption reducing device 700 includes an information-receiving module for the first automatic gain control 710, an information-receiving module for the second automatic gain control 720, a signal-comparing module 730, and a current-adjusting module 740. The information-receiving module for the first automatic gain control 710 connected to the first automatic gain control 608 receives a first automatic gain control (AGC) information corresponding to the first detecting value. In one embodiment, the first detecting value represents the amplitude of the signal before being inputted to the channel selection filter (CSF) 604. The information-receiving module for the second automatic gain control 720 connected to the second automatic gain control 610 receives a second automatic gain control information corresponding to the second detecting value. In one embodiment, the second detecting value represents the amplitude of the signal after being outputted from the channel selection filter (CSF) 604.

The signal-comparing module 730 compares the first automatic gain control information and the second automatic gain control information respectively with a setting threshold value to generate a comparing result for determining an amplitude of a wanted signal and determining whether the interference signal is inherent in the frequency-reduced signal. That is, the signal-comparing module 730 compares the signals before inputting and outputted from the channel selection filter (CSF) 604 with the setting threshold value. The current-adjusting module 740 selects one of a maximum current, an intermediate current, and a minimum current of the current based on the comparing result. In other words, the current-adjusting module 740 selectively provides the maximum current, intermediate current, or minimum current to the channel selection filter (CSF) 604.

In one case, with respect to the signal quality received by the receiver 600, the amplitude of the wanted signal is less than the amplitude of the interference signal. In another case, the amplitude of the wanted signal is greater than the amplitude of the interference signal.

Figure 9:
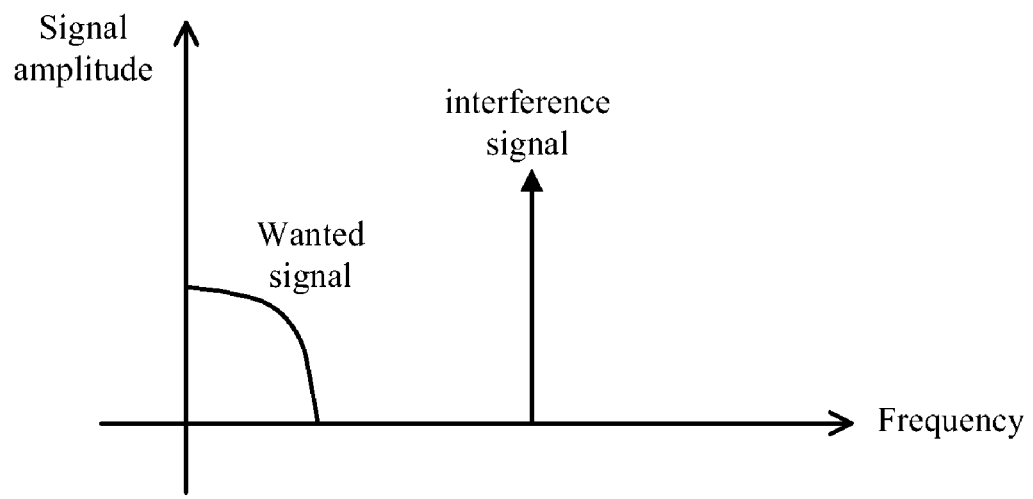
FIG. 9 is a schematic view of the signal before being inputted into the channel selection filter according to one embodiment of the present invention.
Figure 10:
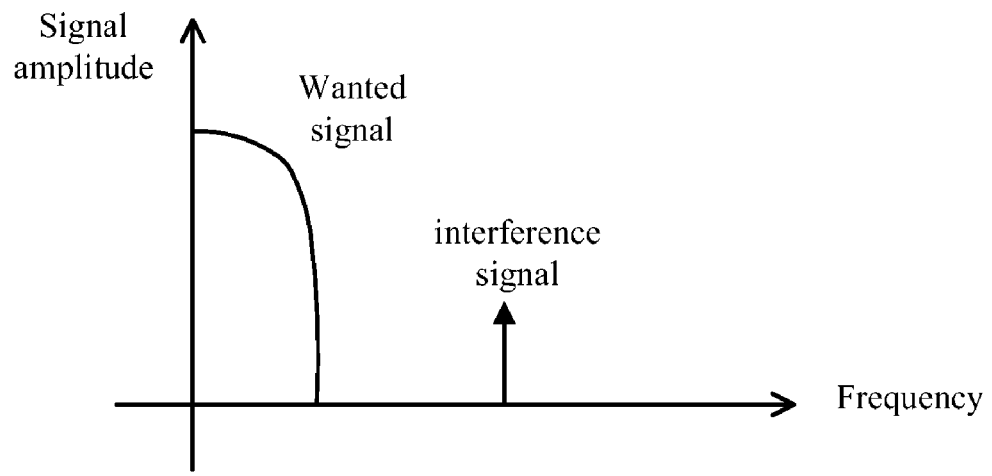
FIG. 10 is a schematic view of the signal after being outputted from the channel selection filter according to one embodiment of the present invention.

Please refer to FIGS. 9 and 10. FIG. 9 is a schematic view of the signal before being inputted into the channel selection filter (CSF) 604 according to one embodiment of the present invention. FIG. 10 is a schematic view of the signal after being outputted from the channel selection filter (CSF) 604 according to one embodiment of the present invention. In FIG. 9, the information-receiving module for the first automatic gain control 710 receives the signal including the interference signal (or termed "jammer"). The information-receiving module for the second automatic gain control 720 receives the wanted signal after the signal is filtered away the interference signal.

The signal-comparing module 730 compares the first automatic gain control information and the second automatic gain control information of the signal with a setting threshold value, respectively. The current-adjusting module 740 adjusts the current to reduce the undue power consumption.

While the comparing result generated by the signal-comparing module 730 represents that the first automatic gain control (AGC) information, i.e. the first detecting value, and the second automatic gain control (AGC) information, i.e. the second detecting value, are both greater than the setting threshold value, the power consumption reducing device 700 determines that the signal inputted into the channel selection filter (CSF) 604 approximately has no component of the interference signal. In such a situation, since the signal to noise ration (SNR) is higher than a predetermined value, the noise characteristics requirements of the low noise amplifier (LNA) 602, a frequency converter 603, a channel selection filter (CSF) 604, and a programmable gain amplifier (PGA) 605 can be beneficially loosened. Moreover, there is no need to filter the interference signal in the channel selection filter (CSF) 604. Therefore, the current-adjusting module 740 selects the minimum current of the current to be provided to the channel selection filter (CSF) 604.

While the comparing result generated by the signal-comparing module 730 represents that the first automatic gain control information, i.e. the first detecting value, is greater that the setting threshold value and the second automatic gain control information, i.e. the second detecting value, is less than the setting threshold value, the power consumption reducing device 700 determines that the signal inputted into the channel selection filter (CSF) 604 has the interference signal with large amplitude. In such a situation, the current-adjusting module 740 supplies more current to the channel selection filter (CSF) 604 in order to increase the gain-bandwidth thereby increasing out-band $3^{rd}$ input intercept point (IIP3) for preventing the signal from distortion. That is, conventional receiver consumes a lot of current in this situation, thereby resulting in large power consumption. The current-adjusting module 740 of the present invention selects the maximum current of the current to be provided to the channel selection filter (CSF) 604.

While the comparing result generated by the signal-comparing module 730 represents that the first automatic gain control information, i.e. the first detecting value, and the second automatic gain control information, i.e. the second detecting value, are both less than the setting threshold value, the power consumption reducing device 700 determines that the signal inputted into the channel selection filter (CSF) 604 has the interference signal with small amplitude. In such a situation, the current-adjusting module 740 supplies the intermediate current to the channel selection filter (CSF) 604 in order to meet the requirement of noise at the optimal point even though the effect of the interference signal is very little. Thus, the current-adjusting module 740 selects the intermediate current of the current to be provided to the channel selection filter (CSF) 604.

Since the interference signal received by the antenna 601 is filtered away by the channel selection filter (CSF) 604, a situation that a smaller signal is detected by the first peak detector (PD1), and a greater signal is detected by the second peak detector (PD2) thus will not exist.

As the above-mentioned descriptions, the current supplied to the receiver 600 is adjusted based on the amplitude of the wanted signal and the existence of the interference signal. Therefore, proper current is provided for the receiver 600 based on the quality of the inputted signal to improve the power consumption of the receiver 600.

Figure 8:
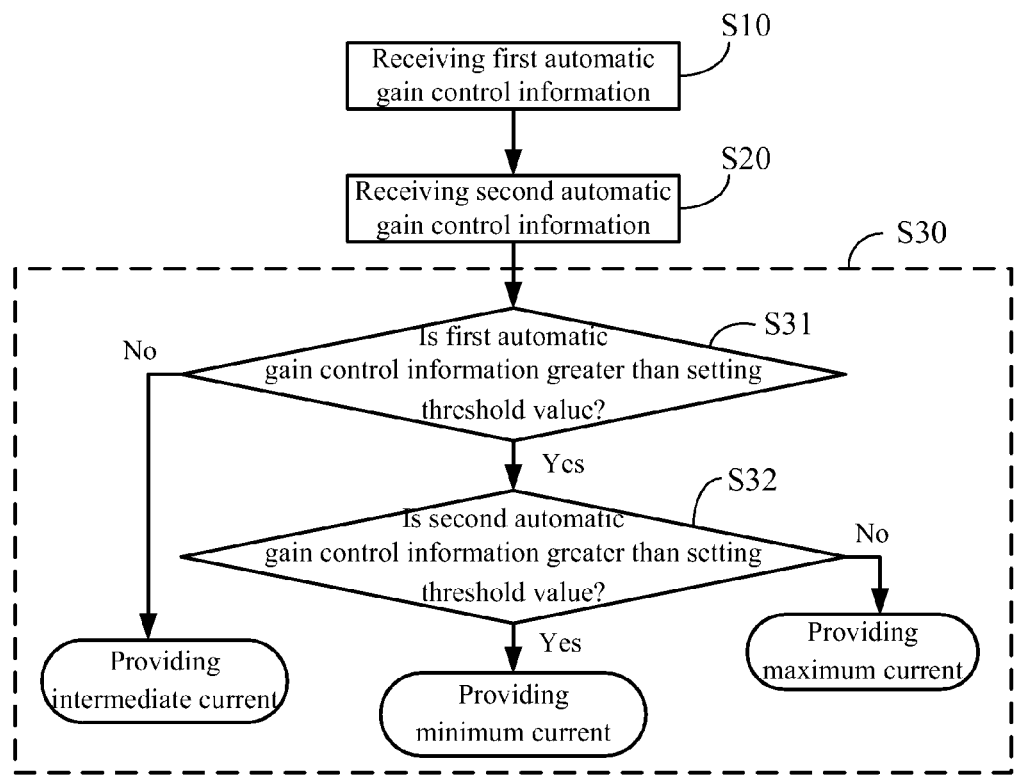
FIG. 8 is a flow chart of reducing the power consumption in the receiver according to one embodiment of the present invention.

The receiver 600 having power consumption reducing device 700 utilizes the automatic gain control information to perform the method of reducing power consumption of the receiver 600. Please refer to FIGS. 6, 7, and 8. FIG. 8 is a flow chart of reducing the power consumption in the receiver 600 according to one embodiment of the present invention.

The channel selection filter (CSF) 604 of the receiver 600 filters away an interference signal. The first peak detector (PD1) 607 of the receiver 600 detects a signal before being inputted into the channel selection filter (CSF) 604 and generates a first detecting value. The first automatic gain control (AGC1) 608 adjusts a gain based on the first detecting value, and the second peak detector (PD2) 609 of the receiver 600 detects a signal after being outputted from the channel selection filter (CSF) 604 and generates a second detecting value. The second automatic gain control (AGC2) 610 adjusts the gain based on the second detecting value. The method comprises the steps of:

In step S10, the first automatic gain control (AGC1) 608 receives a first automatic gain control information (AGC) corresponding to the first detecting value. The first automatic gain control (AGC) information includes the amplitude information of the wanted signal and the interference signal. That is, the first automatic gain control (AGC) information is corresponding to the amplitude information from the first peak detector (PD1) 607 when the first peak detector (PD1) 607 detects the signal before being inputted to the channel selection filter (CSF) 604.

In step S20, the second automatic gain control (AGC2) 610 receives a second automatic gain control (AGC) information corresponding to the second detecting value. The second automatic gain control (AGC) information includes the amplitude information of the wanted signal wherein the interference signal is filtered away by the channel selection filter (CSF) 604. That is, the second automatic gain control (AGC) information is corresponding to the amplitude information obtained from the second peak detector (PD2) 609 when the second peak detector (PD2) 609 detects the signal after being outputted from the channel selection filter (CSF) 604.

In step S30, the power consumption reducing device 700 determines the signal quality of the signal based on the first automatic gain control information and the second automatic gain control information for adjusting current supplied to at least one of the low noise amplifier (LNA) 602, the frequency converter 603, the channel selection filter (CSF) 604 and the at least one programmable gain amplifier (PGA) 605 of the receiver 600 according to the determined result.

During the step of current adjustment in step S30, step S30 further comprises step S31: determining whether the first automatic gain control information is greater than setting threshold value; and step S32: determining whether the second automatic gain control information is greater than setting threshold value, wherein the current comprises a maximum current, an intermediate current, and a minimum current. According to the determined result, the power consumption reducing device 700 adjusts current supplied to at least one of the low noise amplifier (LNA) 602, the frequency converter 603, the channel selection filter (CSF) 604 and the at least one programmable gain amplifier (PGA) 605 of the receiver 600.

The minimum current of the current is supplied to the channel selection filter (CSF) 604 by the current-adjusting module 740 when the first automatic gain control information and the second automatic gain control information are both greater than the setting threshold value. The maximum current of the current is supplied to the channel selection filter (CSF) 604 by the current-adjusting module 740 when the first automatic gain control information is greater than the setting threshold value, and the second automatic gain control information is less than the setting threshold value. The intermediate current of the current is supplied to the channel selection filter (CSF) 604 by the current-adjusting module 740 when the first automatic gain control information and the second automatic gain control information are both less than the setting threshold value.

Comparing to the setting threshold value, when the first automatic gain control (AGC) information is smaller than the setting threshold value, the second automatic gain control (AGC) information is impossible to be a greater value than the setting threshold value. Therefore, there is no need to determine the amplitude of the second automatic gain control (AGC) information. The current corresponding to the noise at the optimal point is provided for the channel selection filter (CSF) 604 to improve the noise characteristics.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A receiver having low power consumption, wherein the receiver amplifies an ultra-high frequency signal received from an antenna by a low noise amplifier, a frequency converter down-converts a frequency of the ultra-high frequency signal for outputting a down-converted signal, a channel selection filter filters away an interference signal of the down-converted signal, and at least one programmable gain amplifier amplifies the down-converted signal for outputting a gain-amplified signal having a predetermined amplitude, and wherein a first peak detector of the receiver detects the down-converted signal before being inputted into the channel selection filter and generates a first detecting value, a first automatic gain control adjusts a gain of either the low noise amplifier or the frequency converter based on the first detecting value, a second peak detector of the receiver detects the down-converted signal after being outputted from the channel selection filter and generates a second detecting value, a second automatic gain control adjusts the gain of either the channel selection filter or the programmable gain amplifier based on the second detecting value, the receiver having a low power consumption comprising:

a power consumption reducing device, determining a signal quality of the ultra-high frequency signal received from the antenna based on the first detecting value and the second detecting value, wherein the power consumption reducing device adjusts current supplied to at least one of the low noise amplifier, the frequency converter, the channel selection filter and the at least one programmable gain amplifier according to the determined result.

2. The receiver of claim 1, wherein the power consumption reducing device further comprises:

an information-receiving module for the first automatic gain control coupled to the first automatic gain control, for receiving a first automatic gain control information corresponding to the first detecting value;

an information-receiving module for the second automatic gain control coupled to the second automatic gain control, for receiving a second automatic gain control information corresponding to the second detecting value;

a signal-comparing module, for comparing the first automatic gain control information and the second automatic gain control information with a setting threshold value, respectively, to generate a comparing result for determining an amplitude of a wanted signal and determining whether the interference signal is inherent in the down-converted signal; and a current-adjusting module, for selecting one of a maximum current, an intermediate current, and a minimum current of the current based on the comparing result.

3. The receiver of claim 2, wherein while the comparing result generated by the signal-comparing module represents that the first automatic gain control information and the second automatic gain control information are both greater than the setting threshold value, the current-adjusting module selects the minimum current of the current to be provided to the channel selection filter.

4. The receiver of claim 2, wherein while the comparing result generated by the signal-comparing module represents that the first automatic gain control information is greater that the setting threshold value, and the second automatic gain control information is less than the setting threshold value, the current-adjusting module selects the maximum current of the current to be provided to the channel selection filter.

5. The receiver of claim 2, wherein while the comparing result generated by the signal-comparing module represents that the first automatic gain control information and the second automatic gain control information are both less than the setting threshold value, the current-adjusting module selects the intermediate current of the current to be provided to the channel selection filter.

6. A method of reducing power consumption of a receiver, wherein a channel selection filter of the receiver filters away an interference signal, a first peak detector of the receiver detects a signal before being inputted into the channel selection filter and generates a first detecting value, a first automatic gain control adjusts a gain based on the first detecting value, a second peak detector of the receiver detects a signal after being outputted from the channel selection filter and generates a second detecting value, a second automatic gain control adjusts the gain based on the second detecting value, the method comprising the steps of:

receiving a first automatic gain control information corresponding to the first detecting value from the first automatic gain control;

receiving a second automatic gain control information corresponding to the second detecting value from the second automatic gain control; and determining signal quality of the signal based on the first automatic gain control information and the second automatic gain control information for adjusting at least a current supplied to at least one of the low noise amplifier, the frequency converter, the channel selection filter and the at least one programmable gain amplifier of the receiver according to the determined result.

7. The receiver of claim 6, wherein the current comprises a maximum current, an intermediate current, and a minimum current, and during the step of: adjusting the current supplied to at least one of the low noise amplifier, the frequency converter, the channel selection filter and the at least one programmable gain amplifier of the receiver according to the determined result, further comprising the steps of:

determining whether the first automatic gain control information is greater than a setting threshold value, wherein when the first automatic gain control information is greater than the setting threshold value, the receiver determines whether the second automatic gain control information is greater than the setting threshold value;

supplying the minimum current of the current to the channel selection filter when the first automatic gain control information and the second automatic gain control information are both greater than the setting threshold value;

supplying the maximum current of the current to the channel selection filter when the first automatic gain control information is greater than the setting threshold value, and the second automatic gain control information is less than the setting threshold value; and supplying the intermediate current of the current to the channel selection filter when the first automatic gain control information and the second automatic gain control information are both less than the setting threshold value.

* * * * *